(12) United States Patent
Kim et al.

(10) Patent No.: US 11,619,968 B2
(45) Date of Patent: Apr. 4, 2023

(54) DISPLAY DEVICE

(71) Applicant: Samsung Display Co., Ltd., Yongin-si (KR)

(72) Inventors: Sangjae Kim, Seongnam-si (KR); Seung-Ho Jung, Hwaseong-si (KR); In-Woo Jeong, Anyang-si (KR); Seunghwa Ha, Cheongju-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/526,919

(22) Filed: Nov. 15, 2021

(65) Prior Publication Data

US 2022/0283606 A1 Sep. 8, 2022

(30) Foreign Application Priority Data

Mar. 5, 2021 (KR) .................. 10-2021-0029294

(51) Int. Cl.
*G06F 1/16* (2006.01)
*H01L 27/32* (2006.01)

(52) U.S. Cl.
CPC ........ *G06F 1/1616* (2013.01); *H01L 27/3218* (2013.01)

(58) Field of Classification Search
CPC .................................................. G06F 1/1652
See application file for complete search history.

(56) References Cited

U.S. PATENT DOCUMENTS

| | | | |
|---|---|---|---|
| 8,680,539 B2 | 3/2014 | Shim et al. | |
| 9,295,168 B2* | 3/2016 | Baek | H01L 51/0097 |
| 10,600,989 B1 | 3/2020 | Ai et al. | |
| 10,915,144 B2* | 2/2021 | Namkung | G02F 1/133305 |
| 11,283,032 B2* | 3/2022 | Xia | B32B 3/30 |
| 2012/0206896 A1* | 8/2012 | Suzuki | G06F 1/1681 |
| | | | 361/807 |
| 2012/0307423 A1* | 12/2012 | Bohn | H04M 1/0216 |
| | | | 361/679.01 |

(Continued)

FOREIGN PATENT DOCUMENTS

KR 10-1720588 3/2017

OTHER PUBLICATIONS

Vol. 116 (2009) Acta Physica Polonica A No. 4, p. 585-590,Dispersion Properties of Optical Polymers.

*Primary Examiner* — Adrian S Wilson
(74) *Attorney, Agent, or Firm* — H.C. Park & Associates, PLC

(57) ABSTRACT

A display device includes a first non-folding area, a second non-folding area, and a folding area, which are disposed in a first direction includes a display panel including first to third pixel areas, which are spaced apart from each other on a plane defined in the first direction and a second direction crossing the first direction and a window layer disposed on the display panel. The window layer includes a first rigid part, a second rigid part, and a first soft part, a first interface and a second interface overlaps at least one area of first to third pixel areas on the plane, and an absolute value of a difference in refractive index between the first rigid part and the first soft part is 0.02 or less, and an absolute value of a difference in refractive index between the second rigid part and the first soft part is 0.02 or less.

20 Claims, 10 Drawing Sheets

(56) References Cited

U.S. PATENT DOCUMENTS

2015/0043174 A1\* 2/2015 Han ................... G02F 1/13452
428/156
2015/0227172 A1\* 8/2015 Namkung ............ H01L 27/323
345/173

\* cited by examiner

DISPLAY DEVICE

CROSS-REFERENCE TO RELATED APPLICATION

This application claims priority from and the benefit of Korean Patent Application No. 10-2021-0029294, filed on Mar. 5, 2021, which is hereby incorporated by reference for all purposes as if fully set forth herein.

BACKGROUND

Field

Embodiments of the invention relate generally to a display device, and more specifically, to a foldable display device having improved visibility, high strength, and improved folding characteristics.

Discussion of the Background

A display device displays various images on a display screen to provide information to a user. In general, a display device displays information within an assigned screen. In recent years, a flexible display device including a foldable or bendable flexible display panel is being developed. The flexible display device that is capable of being variously changed in shape may be portable regardless of a size of an existing screen, to thereby improve a user's convenience in viewing images and text on the screen.

Developments of a window for protecting a screen portion from an external impact while enabling various folding operations in the flexible display are being studied.

The above information disclosed in this Background section is only for understanding of the background of the inventive concepts, and, therefore, it may contain information that does not constitute prior art.

SUMMARY

Devices constructed according to embodiments of the invention are capable of reducing an image discontinuity problem for a display device by using materials having a difference in refractive index in different color wavelength regions of about 0.02 or less, and having an arrangement structure of pixels overlapping an area between a window part and a soft part to minimize the total reflection occurring on a display part of the display device.

The embodiments described below provide for a display device that is capable of removing a sense of discontinuity of an image at a folded portion while securing high strength and excellent folding characteristics.

Additional features of the inventive concepts will be set forth in the description which follows, and in part will be apparent from the description, or may be learned by practice of the inventive concepts.

An embodiment of the inventive concepts provides a display device including a first non-folding area, a second non-folding area, and a folding area disposed between the first non-folding area and the second non-folding area, which are disposed in a first direction, the display device including: a display panel including first to third pixel areas, which are spaced apart from each other on a plane defined in the first direction and a second direction crossing the first direction; and a window layer disposed on the display panel, wherein the window layer includes a first rigid part corresponding to the first non-folding area, a second rigid part corresponding to the second non-folding area, and a first soft part corresponding to the folding area, each of a first interface between the first rigid part and the first soft part and a second interface between the second rigid part and the first soft part overlaps at least one area of first to third pixel areas on the plane, and each of an absolute value of a difference in refractive index between the first rigid part and the first soft part, which is measured at a center wavelength of light emitted from the pixel area overlapping the first interface, and an absolute value of a difference in refractive index between the second rigid part and the first soft part, which is measured at a center wavelength of light emitted from the pixel area overlapping the second interface, is 0.02 or less.

Each of the first interface and the second interface may overlap the first pixel areas on the plane.

Each of the first interface and the second interface may overlap the second pixel areas and the third pixel areas on the plane.

Each of absolute values of a difference in refractive index between the first rigid part and the first soft part and between the second rigid part and the first soft part, which are respectively measured at center wavelengths of the light emitted from the second pixel areas and the third pixel areas, may be about 0.02 or less.

The light emitted from the first pixel areas may have a center wavelength range of 410 nm to 480 nm, the light emitted from the second pixel areas may have a center wavelength range of 500 nm to 570 nm, and the light emitted from the third pixel areas may have a center wavelength range of 625 nm to 675 nm.

The first pixel areas may be arranged in the second direction to define a first area, the second pixel areas and the third pixel areas may be alternately arranged in the second direction to define a second area, and the first area and the second area may be disposed to be spaced apart from each other in the first direction.

Each of the first pixel areas may have a surface area greater than that of each of the second pixel areas and the third pixel areas on the plane.

The display device may further include a second soft part disposed between the display panel and the window layer.

The display device may further include a third soft part disposed on the window layer.

The second soft part and the third soft part may be made of the same material.

The display device may further include a protective layer disposed on the third soft part.

Each of the first rigid part and the second rigid part may have a compression modulus of 15 GPa or more, and the first soft part may have a compression modulus of less than 15 GPa.

In an embodiment, a display device including a first non-folding area, a second non-folding area, and a folding area disposed between the first non-folding area and the second non-folding area, which are disposed in a first direction, includes: a display panel including a first area, which includes first pixel areas arranged to be spaced apart from each other in a second direction crossing the first direction, and a second area, which includes second pixel areas and third pixel areas, which are alternately arranged in the second direction, wherein the first area and the second area are alternately disposed in the first direction; and a window layer disposed on the display panel, wherein the window layer includes a first rigid part corresponding to the first non-folding area, a second rigid part corresponding to the second non-folding area, and a first soft part corresponding to the folding area, and pixel areas on which a first interface between the first rigid part and the first soft part and a second interface between the second rigid part and the first soft part overlap each other are the same.

Each of an absolute value of a difference in refractive index between the first rigid part and the first soft part, which is measured at a center wavelength of the light emitted from the pixel area overlapping the first interface and an absolute value of a difference in refractive index between the second rigid part and the first soft part, which is measured at a center wavelength of the light emitted from the pixel area overlapping the second interface, may be 0.02 or less.

Each of the first pixel areas may have a surface area greater than that of each of the second pixel areas and the third pixel areas on the plane.

Each of the first interface and the second interface may overlap the first area, and the light emitted from the first pixel areas may have a center wavelength range of 410 nm to 480 nm.

Each of the first interface and the second interface may overlap the second area, and each of absolute values of a difference in refractive index between the first rigid part and the first soft part and between the second rigid part and the first soft part, which are respectively measured at center wavelengths of the light emitted from the second pixel areas and the third pixel areas, may be 0.02 or less.

The light emitted from the second pixel areas may have a center wavelength range of 500 nm to 570 nm, and the light emitted from the third pixel areas may have a center wavelength range of 625 nm to 675 nm.

The display device may further include a second soft part disposed between the display panel and the window layer.

The display device may further include a third soft part disposed on the window layer, wherein the window layer may have a thickness less than that of each of the second soft part and the third soft part.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the inventive concepts.

DETAILED DESCRIPTION

Figure 1:
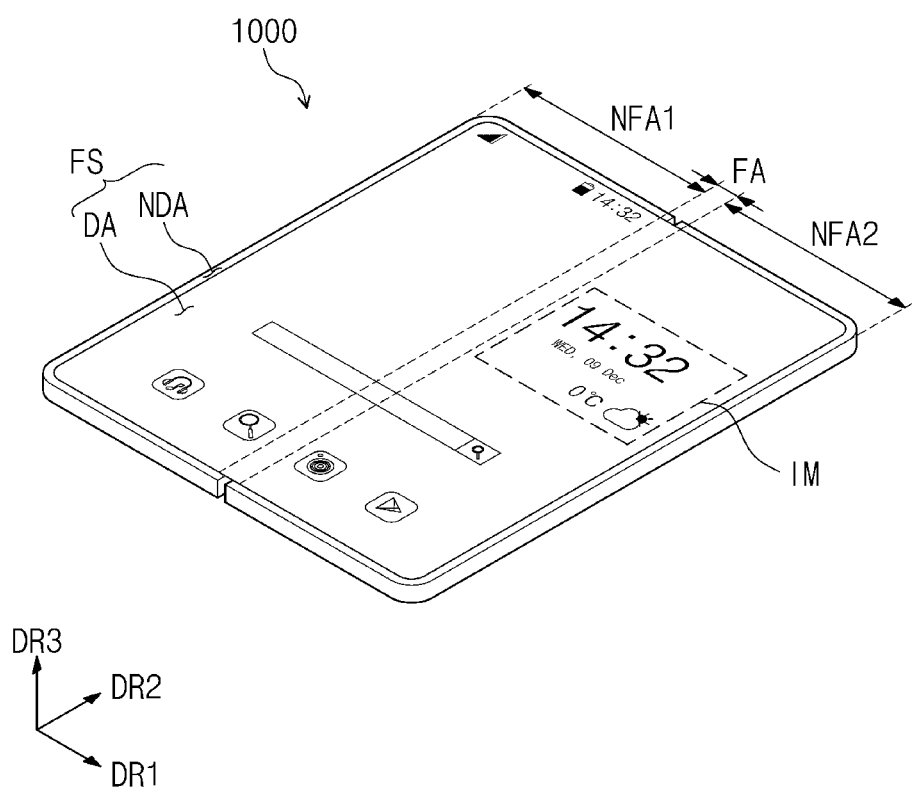
FIG. 1 is a perspective view of a display device according to an embodiment that is constructed according to principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the illustrative term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, a display device according to an embodiment will be described with reference to the accompanying drawings.

Figure 2A:
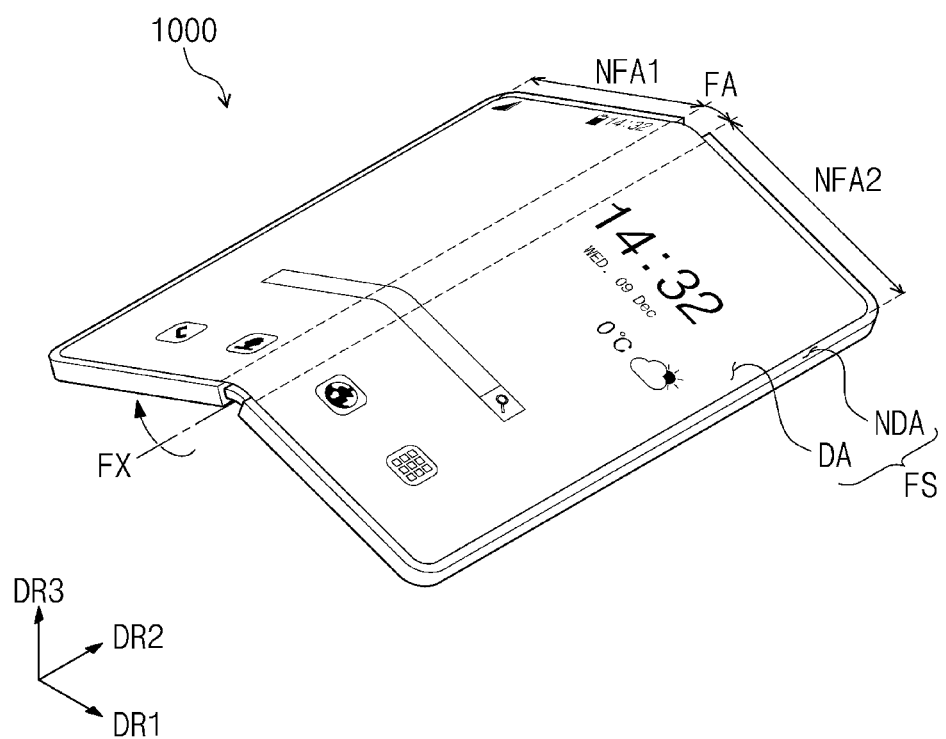
FIGS. 2A and 2B are perspective views of the display device according to an embodiment.
Figure 2B:
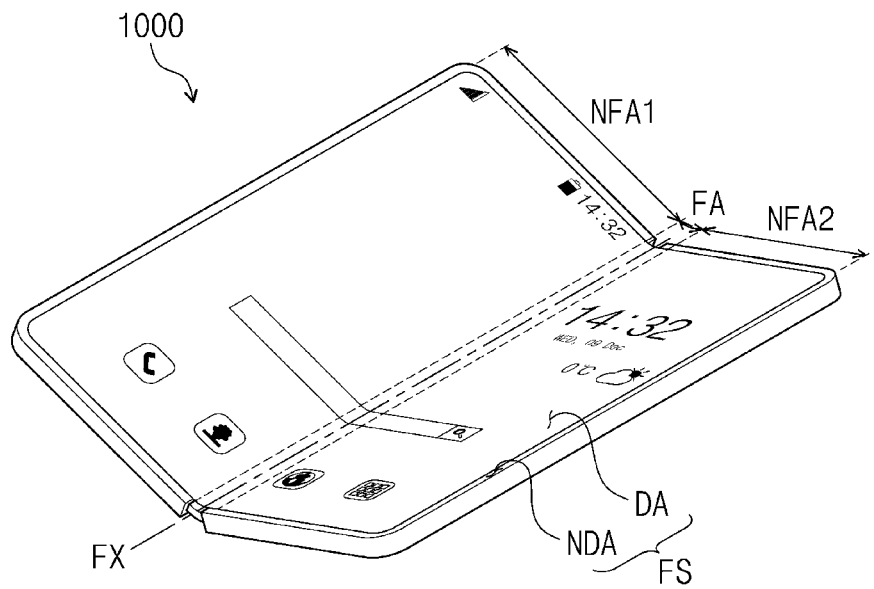

FIG. 1 is a perspective view of a display device according to an embodiment that is constructed according to principles of the invention. FIGS. 2A to 2B are perspective views of the display device according to an embodiment. FIG. 1 illustrates a display device 1000 that is in an unfolded state, and FIGS. 2A to 2B illustrate the display device 1000 that is in a folded state.

The display device 1000 may be a device that is activated according to an electrical signal. The display device 1000 may be applied to electronic devices according to various embodiments. For example, the display device 1000 may be applied to electronic devices such as a mobile phone, a smart watch, a tablet, a notebook, a computer, a smart television, and the like. The display device according to an embodiment is not limited to the foregoing embodiments and may be applied to other electronic devices as long as the display device does not depart from the scope of the invention as described herein. In FIG. 1, the display device 1000 applied to a mobile phone is illustrated as an example.

The display device 1000 may display an image externally. A front surface of the display device 1000 may be divided into a display area DA and a non-display area NDA. The front surface of the display device 1000 may be parallel to a plane defined by a first direction DR1 and a second direction DR2. The front surface of the display device 1000 may correspond to a display surface FS on which an image is displayed. The display device 1000 may provide the image to a user through the display surface DS.

In the unfolded state, the display area DA of the display device 1000 may be parallel to the plane defined by the first direction DR1 and the second direction DR2 and may display the image in a third direction DR3.

A thickness direction of the display device 1000 may be parallel to the third direction DR3 crossing the first direction DR1 and the second direction DR2. A front surface (or top surface) and a rear surface (or bottom surface) of each of members constituting the display device 1000 may be opposed to each other in the third direction DR3, and a normal direction of each of the front and rear surfaces may be parallel to the third direction DR3. The directions indicated as the first to third directions DR1, DR2, and DR3 may be a relative concept and thus changed into different directions.

The non-display area NDA is an area on which an image is not displayed. The non-display area NDA may be adjacent to the display area DA. As illustrated in FIG. 1, the non-display area NDA may surround the display area DA. However, the embodiment is not limited thereto, and the non-display area NDA may be designed to be adjacent to only one side of the display area DA or may be omitted.

The display device 1000 according to an embodiment may be a flexible display device that is foldable or bendable. In this specification, the term flexible refers to a property that is bendable and may be a structure that is bent to be fully folded, but is not limited thereto and be maintained in a partially bent state.

The display device 1000 includes a first non-folding area NFA1, a second non-folding area NFA2, and a folding area FA disposed between the first non-folding area NFA1 and the second non-folding area NFA2, which are disposed in the first direction DR1. The folding area FA may be a flat or bent area according to a folding operation, and each of the first non-folding area NFA1 and the second non-folding area NFA2 may be an area that is maintained to be flat according to the folding operation. Each of the folding area FA and the non-folding area NFA1 and NFA2 may be defined in plurality and may not be limited to a specific embodiment.

The display device 1000 may be folded around a folding axis FX extending in one direction. FIGS. 2A and 2B illustrate the display device 1000 according to an embodiment, which is folded around the folding axis FX extending in the second direction DR2. However, the extending direction of the folding axis FX is not limited thereto, and the folding axis FX may extend in the first direction DR1. In this case, the plurality of non-folding areas may be arranged in the second direction DR2 with the folding area therebetween.

The display device 1000 may be folded at a predetermined angle around the folding axis FX. FIGS. 2A and 2B illustrate the display device 1000 in a state before being fully folded, and the display device 1000 may be fully folded at an angle of about 180 degrees.

Referring to FIG. 2A, the folding area FA of the display device 1000 may define a curved surface that is convexly curved toward the folding axis FX. This may be referred to as an out-folded state of the display device 1000. In the out-folded state, the display area DA may be exposed to the outside. In a fully out-folded state, the first non-folding area NFA1 and the second non-folding area NFA2 may display images in directions opposite to each other.

Referring to FIG. 2B, the folding area FA of the display device 1000 may define a curved surface that is concavely curved toward the folding axis FX. This may be referred to as an in-folded state of the display device 1000. In the in-folded state, the display area DA may not be exposed to the outside. In a fully in-folded state, the first non-folding area NFA1 and the second non-folding area NFA2 may face each other.

In this embodiment, the display device 1000 is illustrated to be unfolded, out-folded, or in-folded around the folding axis FX. However, if the display device 1000 is foldable around the folding axis FX, an operation of the display device 1000 is not limited to a specific embodiment, and may be designed in various forms.

Figure 3:
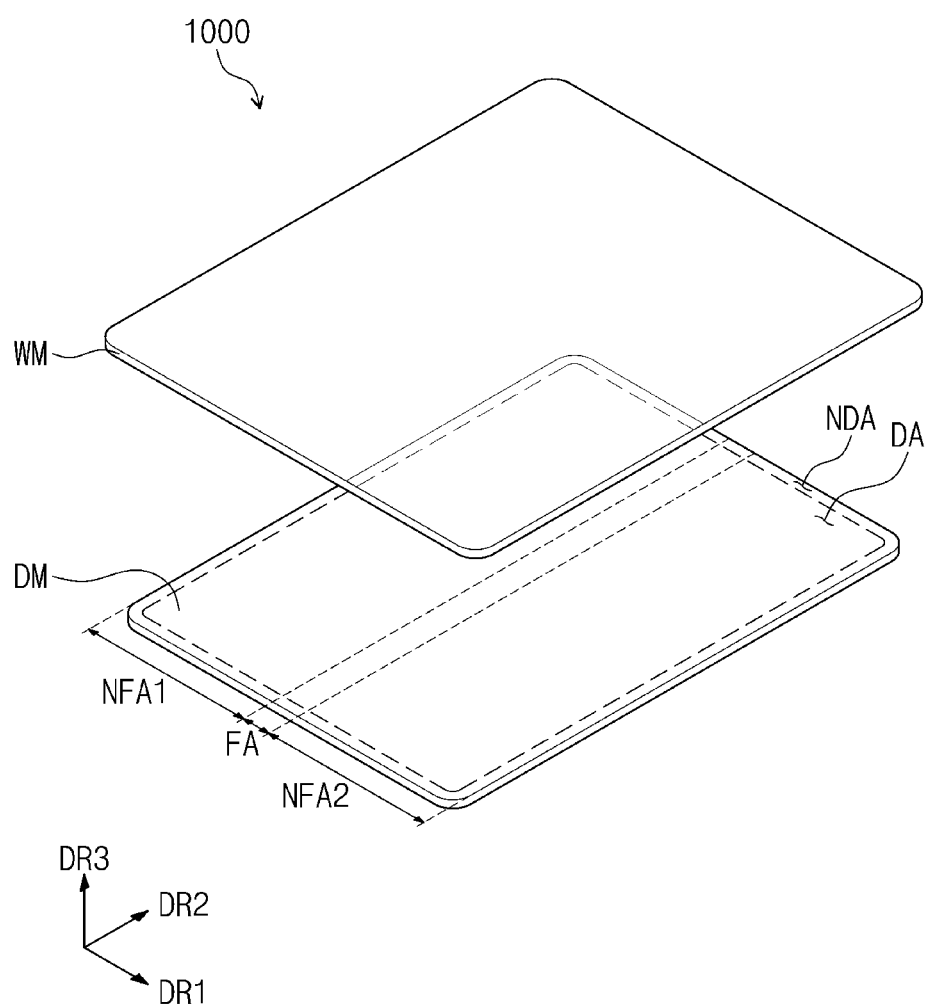
FIG. 3 is an exploded perspective view of the display device according to an embodiment.

FIG. 3 is an exploded perspective view of the display device according to an embodiment. The display device 1000 may include a display module DM and a window module WM, which are sequentially laminated in the third direction DR3. Each of the display module DM and the window module WM may be folded around the folding axis FX (see FIGS. 2A and 2B).

Referring to FIG. 3, the display device 1000 may include a window module WM and a display module DM. Although not shown separately, the display device 1000 may further include a support member supporting the display module DM. The support member may be disposed under the display module DM to support the display module DM and prevent the display module DM from being deformed. The support member may have an integrated plate shape corresponding to a shape of the display module DM. The support member having the integrated plate shape may include a structure that overlaps the folding area FA to increases in flexibility. The embodiment is not limited thereto, and the support member may have two or more plate shapes spaced apart from each other with the folding area FA therebetween.

The window module WM may be disposed on the display module DM to protect the display module DM. The window module WM may prevent the display module DM from being damaged or malfunctioned due to an external impact. The window module WM may include an optically transparent insulating material. Thus, an image generated in the display module DM may pass through the window module WM and thus be recognized by the user. That is, the display surface of the display device 1000 may be defined by the window module WM.

The display module DM may be a module that generates an image according to an electrical signal. The display module DM may include a display panel DP (see FIG. 5). The display panel DP (see FIG. 5) may generate an image. The display panel DP (see FIG. 5) may be a liquid crystal display panel or an emissive display panel, and is not particularly limited thereto. For example, the emissive display panel may be an organic light emitting display panel or a quantum dot light emitting display panel. The organic light emitting display panel may include an organic light emitting material. An emission layer of the quantum dot light emitting display panel may include a quantum dot, a quantum rod, and the like. In some implementations, the display device 1000 may further include an input sensing unit disposed on the display module DM.

Figure 4:
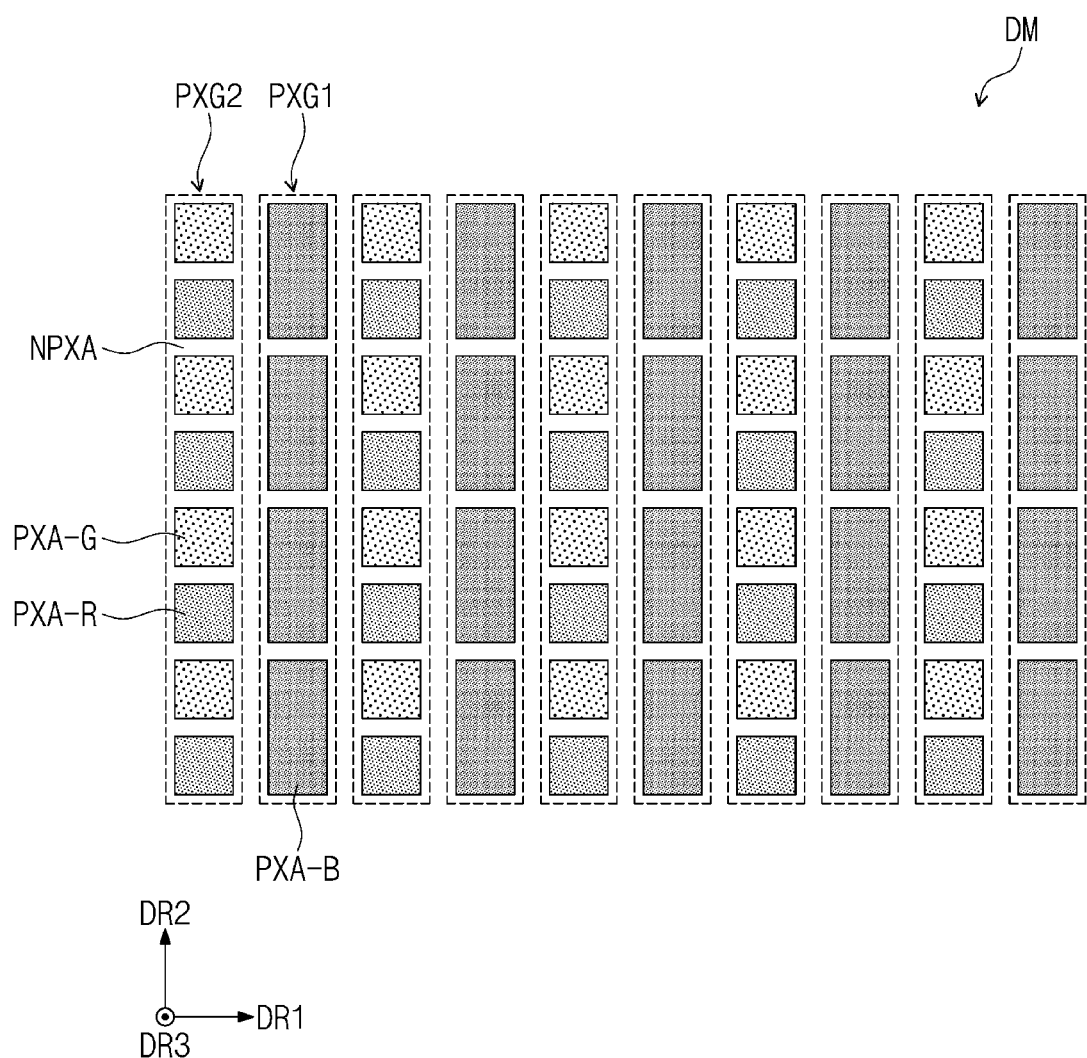
FIG. 4 is an enlarged plan view illustrating a portion of a display module provided in the display device according to an embodiment.

FIG. 4 is an enlarged plan view illustrating a portion of the display module provided in the display device according to an embodiment. The display module DM may include a non-emission area NPXA and first to third pixel areas PXA-B, PXA-G, and PXA-R. Each of the first to third pixel areas PXA-B, PXA-G, and PXA-R may be an area from which light generated by a light emitting element is emitted. The first to third pixel areas PXA-B, PXA-G, and PXA-R may have surface areas different from each other. Here, each of the surface areas may be defined as a surface area when viewed on a plane defined by the first direction DR1 and the second direction DR2.

The first to third pixel areas PXA-B, PXA-G, and PXA-R may be areas divided by the non-emission area NPXA. The non-emission area NPXA may be an area between the pixel areas PXA-B, PXA-G, and PXA-R, which are adjacent to each other.

The first to third pixel areas PXA-B, PXA-G, and PXA-R may be divided into a plurality of groups according to a color of the emitted light. FIG. 4 illustrates an example in which the display module DM includes three pixel areas PXA-B, PXA-G, and PXA-R, which emit blue light, green light, and red light. For example, the display device 1000 (see FIG. 1) according to an embodiment may include the first pixel area PXA-B, the second pixel area PXA-G, and the third pixel area PXA-R, which are distinguished from each other.

In an embodiment, a center wavelength range of light emitted from the first pixel area PXA-B may be about 410 nm to about 480 nm. A center wavelength range of light emitted from the second pixel area PXA-G may be about 500 nm to about 570 nm. A center wavelength range of light emitted from the third pixel area PXA-R may be about 625 nm to about 675 nm.

Referring to FIG. 4, the first pixel areas PXA-B may be arranged in the second direction to define a first group PXG1. The second pixel areas PXA-G and the third pixel areas PXA-R may be alternately arranged in the second direction to define a second group PXG2.

The first group PXG1 may be disposed to be spaced apart from the second group PXG2 in the first direction DR1. Each of the first group PXG1 and the second group PXG2 may be provided in plurality. The first group PXG1 and the second group PXG2 may be alternately arranged in the first direction DR1.

One second pixel area PXA-G may be disposed to be spaced apart from one first pixel area PXA-B in the first direction DR1 and also may be disposed to be spaced apart from one third pixel area PXA-R in the second direction DR2. One third pixel area PXA-R may be disposed to be spaced apart from one first pixel area PXA-B in the first direction DR1 and also may be disposed to be spaced apart from one second pixel area PXA-G in the second direction DR2.

The entire pixel area including the first pixel area PXA-B, the second pixel area PXA-G, and the third pixel area PXA-R may be provided by a combination of a quad-type array structure and a stripe-type array structure. The first pixel areas PXA-B may be arranged in the stripe type, and the second pixel areas PXA-G and the third pixel areas PXA-R may be arranged in the quad type. The sum of vertical lengths of the quad-type second pixel area PXA-G and the third pixel area PXA-R may be equal to or less than a length of the first pixel area PXA-B, but is limited thereto.

Figure 5:
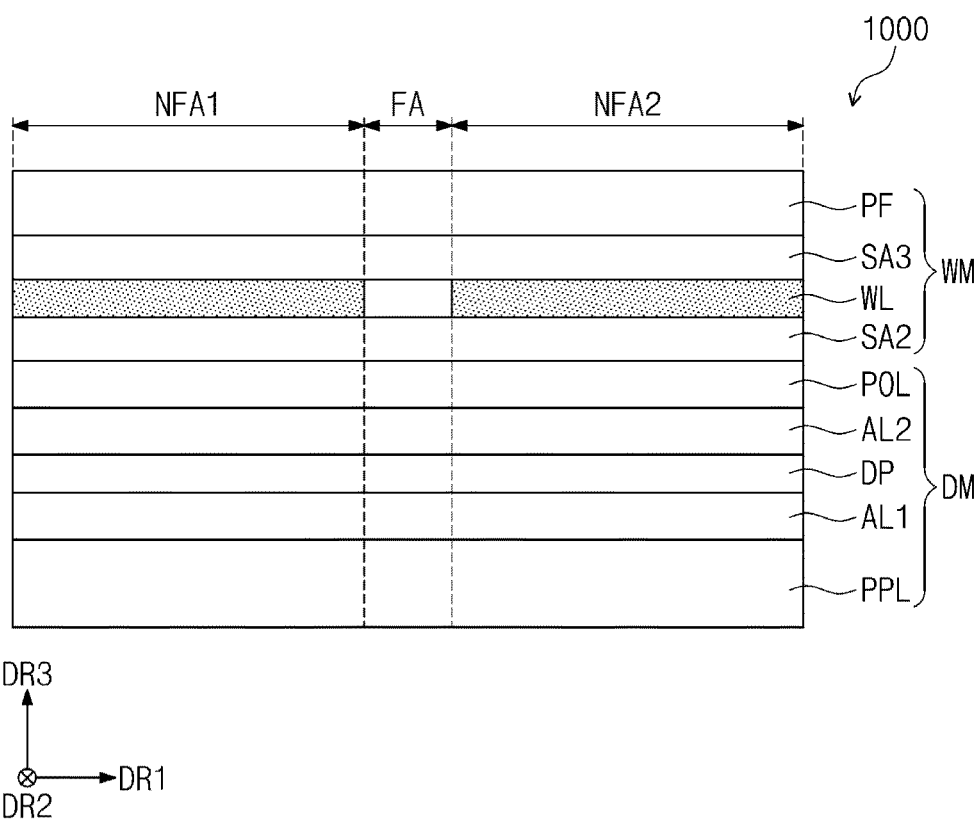
FIG. 5 is a cross-sectional view of the display device according to an embodiment.
Figure 6:
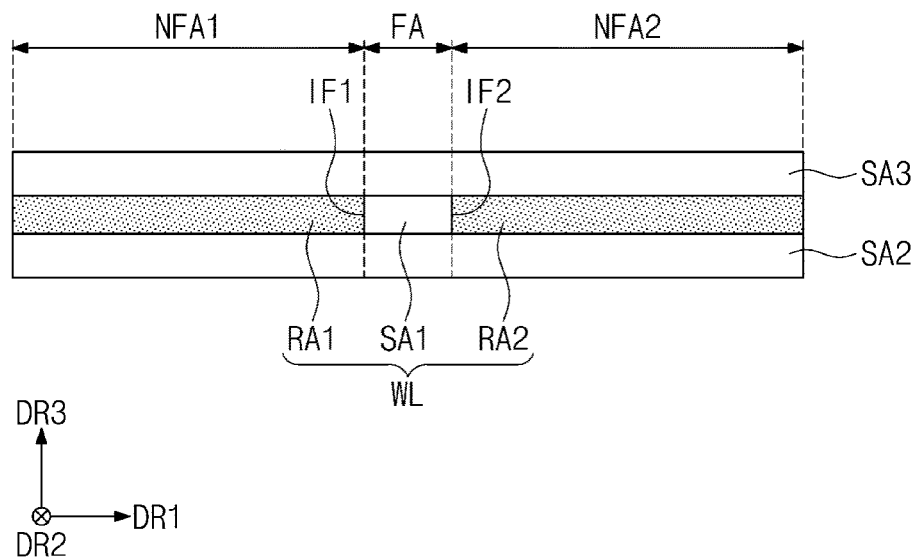
FIG. 6 is an enlarged cross-sectional view illustrating a portion of the display device according to an embodiment.
Figure 7A:
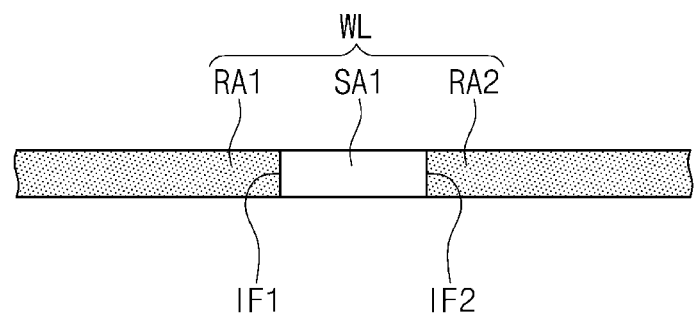
FIG. 7A is an enlarged cross-sectional view illustrating an unfolded state of a window layer according to an embodiment.
Figure 7B:
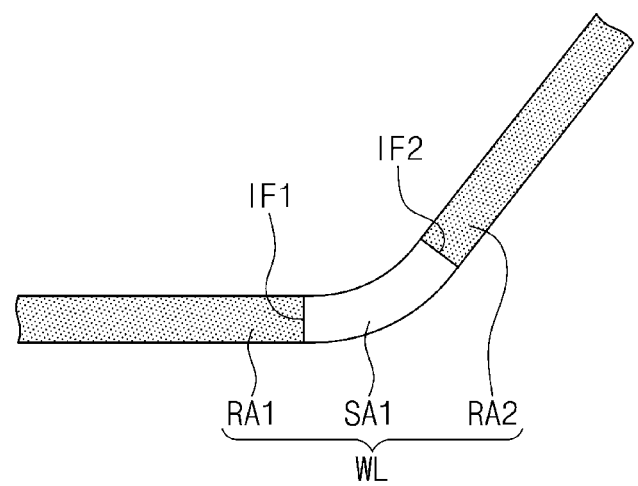
FIG. 7B is an enlarged cross-sectional view illustrating a folded state of the window layer according to an embodiment.

The pixel areas PXA-B, PXA-G, and PXA-R may have surface areas different from each other according to a color emitted from the emission layer of the light emitting element. For example, referring to FIG. 4, in the display device 1000 (see FIG. 1) according to an embodiment, the first pixel area PXA-B emitting the blue light may have the largest surface area, and the second pixel area PXA-G emitting the green light or the third pixel area PXA-R emitting the red light may have a surface area less than that of the first pixel area PXA-B. However, the embodiment is not limited thereto, and the pixel areas PXA-B, PXA-G, and PXA-R may be provided at an area ratio different from that illustrated in FIG. 4. FIG. 5 is a cross-sectional view of the display device 1000 according to an embodiment. FIG. 6 is an enlarged cross-sectional view illustrating a portion of the display device 1000 according to an embodiment. FIG. 7A is an enlarged cross-sectional view illustrating an unfolded state of a window layer WL according to an embodiment. FIG. 7B is an enlarged cross-sectional view illustrating a folded state of the window layer WL according to an embodiment.

Hereinafter, a laminated structure of the display device 1000 according to an embodiment will be described with reference to FIG. 5. As for the description of each component, the above description may be equally applied, and duplicated descriptions will be omitted. Referring to FIG. 5, the display device 1000 includes a display module DM and a window module WM.

Referring to FIG. 5, the window module WM may include a second soft part SA2, a window layer WL, a third soft part SA3, and a window protective layer PF. In an embodiment, the second soft part SA2, the window layer WL, the third soft part SA3, and the window protective layer PF may be sequentially laminated in the third direction DR3.

The window protective layer PF may include a plastic film. The window protective layer PF may have a thickness of about 25 µm or more and about 200 µm or less. More particularly, the window protective layer PF may have a thickness of about 50 µm to about 80 µm. However, the thickness of the window protective layer PF is not limited to the above numerical example.

The window protective layer PF may include polyimide, polycarbonate, polyamide, triacetylcellulose, polymethylmethacrylate, or polyethylene terephthalate, but is not limited thereto. Although not shown separately, at least one of a hard coating layer, an anti-fingerprint layer, or an anti-reflection layer may be disposed on a top surface of the window protective layer PF.

The window layer WL may be repeatedly unfolded or folded around the folding axis FX (see FIG. 2A). Thus, the shape of the window layer WL may be deformed to correspond to the shape of the display panel DP that is deformed according to the operation of the display device 1000.

The window layer WL includes a first rigid part RA1 and a second rigid part RA2 according to an embodiment. The first soft part SA1 may be disposed between the first rigid part RA1 and the second rigid part RA2. A detailed description of the window layer WL will be described later in more detail.

The second soft part SA2 may be further disposed between the display panel DP and the window layer WL, and the third soft part SA3 may be further disposed on the window layer WL. The second soft part SA2 may allow the anti-reflection layer POL and the window module WM to adhere to each other, and the third soft part SA3 may allow the window module WM and the window protective layer PF to adhere to each other. In this case, the thickness of the window layer WL may be greater than that of each of the second soft part SA2 and the third soft part SA3. However, this embodiment is not limited thereto.

The second soft part SA2 and the third soft part SA3 may protect the window layer WL. That is, the second soft part SA2 and the third soft part SA3 may be configured to protect the first rigid part RA1 and the second rigid part RA2, which are provided in the window layer WL, from an external impact. Each of the second soft part SA2 and the third soft part SA3 may include a pressure sensitive adhesive film (PSA), an optically clear adhesive (OCA), an optically clear resin (OCR), or a combination thereof, and also may include a typical adhesive. Each of the second soft part SA2 and the third soft part SA3 may have a thickness of, for example, about 15 µm to about 100 µm. More particularly, each of the second soft part SA2 and the third soft part SA3 may have a thickness of about 25 µm to about 50 µm. However, the embodiment is not limited thereto.

In an embodiment, the first to third soft parts SA1, SA2, and SA3 may be made of the same material. In a process of forming the window layer WL, a resin may be applied first to an entire top surface of the anti-reflection layer POL and then may be primarily hardened by heat or light to form the second soft part SA2. The first rigid part RA1 and the second rigid part RA2 may be disposed to be spaced apart from each other on the second soft part SA2. A resin may be applied again on the first rigid part RA1 and the second rigid part RA2 and then may be secondarily hardened by the heat or light to form the first soft part SA1 and the third soft part SA3. However, the method of forming the first to third soft parts SA1, SA2, and SA3 is not limited thereto.

The display module DM is disposed under the window module WM. The display module DM includes an anti-reflection layer POL and a display panel DP. If necessary, an adhesive layer may be disposed between the members.

The display panel DP may include a base layer, a circuit element layer disposed on the base layer, a display element layer disposed on the circuit element layer, and a thin film encapsulation layer disposed on the display element layer.

The base layer may be flexible. The base layer may have a single-layered structure or a multi-layered structure. The base layer may include a plastic substrate, a glass substrate, a metal substrate, or an organic/inorganic composite substrate. The base layer may include a synthetic resin film. For example, the synthetic resin film may include a polyimide-based, acrylic-based, vinyl-based, epoxy-based, urethane-based, cellulose-based, or perylene-based resin film. However, the material of the synthetic resin film is not limited to the above example.

The circuit element layer may be disposed on the base layer. The circuit element layer may include an insulating layer, a semiconductor pattern, a conductive pattern, and a signal line. The insulating layer, the semiconductor layer, and the conductive layer may be formed on the base layer in a manner such as coating or vapor deposition, and then, the insulating layer, the semiconductor layer, and the conductive layer may be selectively patterned through a plurality of photolithography processes. As a result, the insulating layer, the semiconductor pattern, the conductive pattern, and the signal line, which are provided in the circuit element layer, may be formed.

The display element layer may be disposed on the circuit element layer. The display element layer may be disposed to correspond to the display area DA of the display device 1000. The display element layer may include a light emitting element such as pixels to be described later. For example, the display element layer may include an organic light emitting material, a quantum dot, a quantum rod, a micro LED element, or a nano LED element.

The encapsulation layer may be disposed on the circuit element layer to cover the display element layer. The encapsulation layer may include inorganic layers and an organic layer disposed between the inorganic layers, but layers constituting the encapsulation layer are not limited thereto. The inorganic layers provided in the encapsulation layer may protect the pixels from moisture/oxygen. The organic layer provided in the encapsulation layer may protect the pixels from foreign substances such as dust particles. For example, the inorganic layers may include a silicon nitride layer, a silicon oxide layer, a silicon oxynitride layer, a titanium oxide layer, or an aluminum oxide layer. The organic layer may include an acrylic-based organic layer or the like. However, the materials of the inorganic layers and the organic layer are not limited to the above example.

The display panel DP may include a plurality of pixels that generate an image according to an electrical signal. Each of the pixels may include a light emitting element provided in the display element layer and a plurality of thin film transistors provided in the circuit element layer and electrically connected to the light emitting element. The pixels may be disposed to correspond to the display area DA. However, the embodiment is not limited thereto, and some of the pixels may be disposed on the non-display area NDA.

The anti-reflection layer POL may reduce reflectance of external light. The anti-reflection layer POL may include a phase retarder and/or a polarizer. The anti-reflection layer POL may include at least polarizing film. The anti-reflection layer POL may include a color filter and a black matrix.

The panel protective layer PPL may be disposed under the display panel DP so as to be closest to the display panel DP. The panel protective layer PPL may protect a lower portion of the display panel DP. The panel protective layer PPL may include a flexible plastic material. For example, the panel protective layer PPL may include polyethylene terephthalate. The first adhesive layer AL1 may allow the panel protective layer PPL and the display panel DP to adhere to each other.

Some of the above-described configurations according to an embodiment may be omitted or further include other configurations.

In an embodiment, the window layer WL includes a first rigid part RA1, a second rigid part RA2, and a first soft part SA1. The first rigid part RA1 may correspond to the first non-folding area NFA1, the second rigid part RA2 may correspond to the second non-folding area NFA2, and the first soft part SA1 may correspond to the folding area FA. In the window layer WL, the first rigid part RA1 and the second rigid part RA2 may be disposed to face each other with the first soft part SA1 therebetween.

Each of the first rigid part RA1 and the second rigid part RA2 may be a light-transmitting hard material. For example, each of the first rigid part RA1 and the second rigid part RA2 may be a thin glass substrate. In an embodiment, each of the first rigid part RA1 and the second rigid part RA2 may have a thickness of about 200 μm or less. For example, each of the first and second rigid parts RA1 and RA2 may have a thickness of about 10 μm to about 100 μm, but is not limited thereto.

The first soft part SA1 may be a light-transmitting material. The first soft part SA1 may include a soft material. For example, the first soft part SA1 may include an optically clear resin (OCR). Since the first soft part SA1 includes the soft material, the window layer WL may be repeatedly unfolded or folded around the folding axis. Thus, the shape of the window layer WL may be deformed to correspond to the shape of the display panel DP that is deformed according to the operation of the display device.

Since the existing foldable display has to have good flexibility as the window material, a polymer films such as polyimide (PI) or polyethylene terephtalate (PET) have been used. However, since the polymer film has relatively low transmittance and is weak in mechanical strength, there is a disadvantage of being vulnerable to impact resistance. The display device according to an embodiment may include the window layer WL including the first soft part SA1 between the first rigid part RA1 and the second rigid part RA1 to satisfy sufficient strength even the repeated contact with a touch pen and a certain pressure while satisfying superior folding characteristics. That is, the superior folding characteristics on the folding area FA may be satisfied while satisfying the strength characteristics on the non-folding areas NFA1 and NFA2.

In an embodiment, each of the first rigid part RA1 and the second rigid part RA2 may have a modulus of about 15 GPa or more. When the range of the modulus values of the first and second rigid parts RA1 and RA2 satisfies the above range, high mechanical strength may be secured, and thus, a large external impact may be absorbed as well as prevention of scratches to improve impact resistance. The modulus value of the first soft part SA1 may be less than that of each of the first rigid part RA1 and the second rigid part RA2. In an embodiment, the first soft part SA1 may have a modulus less than about 15 GPa.

In an embodiment, the materials and thicknesses of the first and second rigid parts RA1 and RA2 may be the same, but are not limited thereto. For example, the first rigid part RA1 and the second rigid part RA2 may be different from each other, and the materials and the thicknesses of the first and second rigid parts RA1 and RA2 may be appropriately selected according to the desired physical properties such as light transmittance and dispersibility.

In an embodiment, a first interface IF1 may be defined between the first rigid part RA1 and the first soft part SA1. The first interface IF1 may correspond to a boundary between the first rigid part RA1 and the first soft part SA1. A second interface IF2 may be defined between the second rigid part RA2 and the first soft part SA1. The second interface IF2 may correspond to a boundary between the second rigid part RA2 and the first soft part SA1. The first interface IF1 and the second interface IF2 may be parallel to the third direction DR3.

Light incident onto the first interface IF1 from the display panel DP may be totally reflected by a difference in refractive index between the first rigid part RA1 and the first soft part SA1. Light incident onto the second interface IF2 from the display panel DP may be totally reflected by a difference in refractive index between the second rigid part RA2 and the first soft part SA1. Due to the total reflection occurring on the first interface IF1 and the second interface IF2, external light extraction efficiency may be deteriorated on the folding area FA, and thus, an image discontinuous phenomenon may occur.

In an embodiment, an absolute value of the difference in refractive index between the first rigid part RA1 and the first soft part SA1, which is measured at a center wavelength of light emitted from the pixel area overlapping the first interface IF1 may be about 0.02 or less. An absolute value of the difference in refractive index between the second rigid part RA2 and the first soft part SA1, which is measured at a center wavelength of light emitted from the pixel area overlapping the second interface IF2 may be about 0.02 or less. When the difference in refractive index between the first rigid part RA1 and the first soft part SA1 and the difference in refractive index between the second rigid part RA2 and the first soft part SA1 satisfy the above-described range, the total reflection occurring on the interfaces IF1 and IF2 may be reduced, and thus, the image discontinuity, which may occur on the folding area FA, may be reduced to improve visibility of the display device. If the absolute value of the difference in refractive index exceeds about 0.02, a total reflection angle at the interfaces IF1 and IF2 may decrease. Thus, the total reflection of the light on the interfaces IF1 and IF2 may increase, and thus, the visibility of the display device may be deteriorated.

Figure 8A:
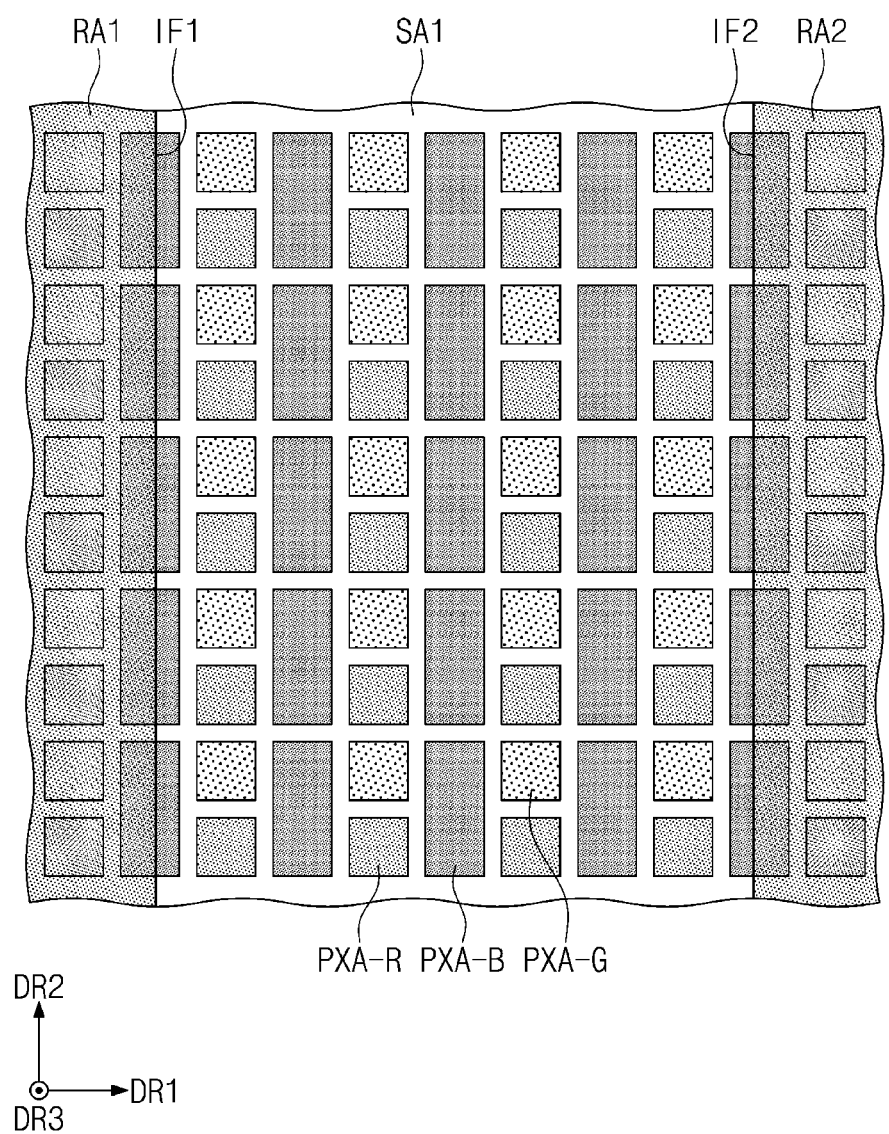
FIG. 8A is an enlarged plan view illustrating a portion of an area of the display device according to an embodiment.
Figure 8B:
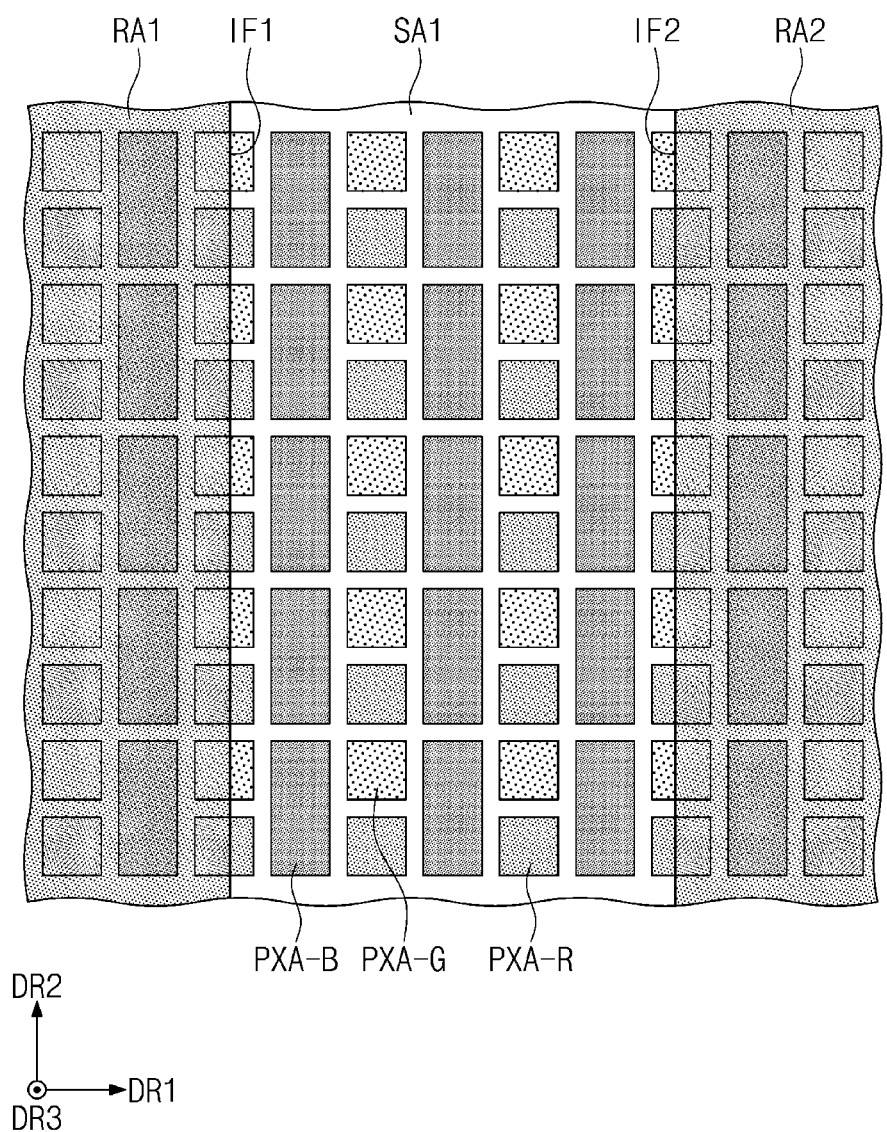
FIG. 8B is an enlarged plan view illustrating a portion of an area of the display device according to an embodiment.

FIGS. 8A and 8B are enlarged plans view illustrating a portion of the area of the display device 1000 according to an embodiment. FIG. 8A illustrates an optimal arrangement structure that is applicable to the material in which a difference in refractive index between the rigid parts RA1 and RA2 and the first soft part SA1 at a wavelength band of the first pixel area PXA-B is minimized. FIG. 8B illustrates an optimal arrangement structure that is applicable to the material in which a difference in refractive index between the rigid parts RA1 and RA2 and the first soft part SA1 at a wavelength band of each of the second pixel area PXA-G and the third pixel area PXA-R is minimized.

Referring to FIGS. 8A and 8B, the total reflection of the light incident onto the interfaces IF1 and IF2 from the pixel area overlapping the interfaces IF1 and IF2 may be high. For example, as illustrated in FIG. 8A, when the interfaces IF1 and IF2 overlap the first pixel areas PXA-B, light emitted from the first pixel areas PXA-B may be totally reflected at the interfaces IF1 and IF2. In this case, when a material having a difference in refractive index, which is similar to that of each of the first and second rigid parts RA1 and RA2 in the center wavelength region of light emitted from the pixel area overlapping the interfaces IF1 and IF2 is used for the first soft part SA1, the reflectance of the light that is totally reflected at the interfaces IF1 and IF2 may be reduced.

Referring to FIG. 8A, each of the first interface IF1 between the first rigid part RA1 and the first soft part SA1 and the second interface IF2 between the second rigid part RA2 and the first soft part SA1 may overlap the first pixel area PXA-B on the plane. That is, the first interface IF1 and the second interface IF2 may overlap the first area PXG1 (see FIG. 4) provided in the first pixel areas PXA-B. In this case, each of an absolute value of a difference between the refractive index of the first soft part SA1 and the refractive index of the first rigid part RA1 and an absolute value of the difference between the refractive index of the first soft part SA1 and the refractive index of the second rigid part RA2 may be about 0.02 or less at the center wavelength of light emitted from the first pixel area PXA-B. Thus, the reflectance when the light emitted from the first pixel area PXA-B overlapping the first interface IF1 and the second interface IF2 is incident onto the first interface IF1 and the second interface IF2 may be reduced, and thus, the image discontinuity on the folding area may be reduced.

Referring to FIG. 8B, each of the first interface IF1 between the first rigid part RA1 and the first soft part SA1 and the second interface IF2 between the second rigid part RA2 and the first soft part SA1 may overlap the second pixel area PXA-G and the third pixel area PXA-R on the plane. That is, the first interface IF1 and the second interface IF2 may overlap the second area PXG2 (see FIG. 4) including the second pixel area PXA-G and the third pixel area PXA-R. In this case, each of an absolute value of a difference between the refractive index of the first soft part SA1 and the refractive index of the first rigid part RA1 and an absolute value of the difference between the refractive index of the first soft part SA1 and the refractive index of the second rigid part RA2 may be about 0.02 or less at the center wavelength of light emitted from each of the second pixel area PXA-G and the third pixel area PXA-R. Thus, the reflectance when the light emitted from the second pixel area PXA-G and the third pixel area PXA-R, which overlap the first interface IF1 and the second interface IF2, is incident onto the first interface IF1 and the second interface IF2 may be reduced, and thus, the image discontinuity on the folding area may be reduced. In the pixel arrangement structure illustrated in FIG. 8A and the pixel arrangement structure illustrated in FIG. 8B, the materials that are used for the first soft part SA1 may be different from each other. However, this embodiment is not limited thereto.

Figure 9A:
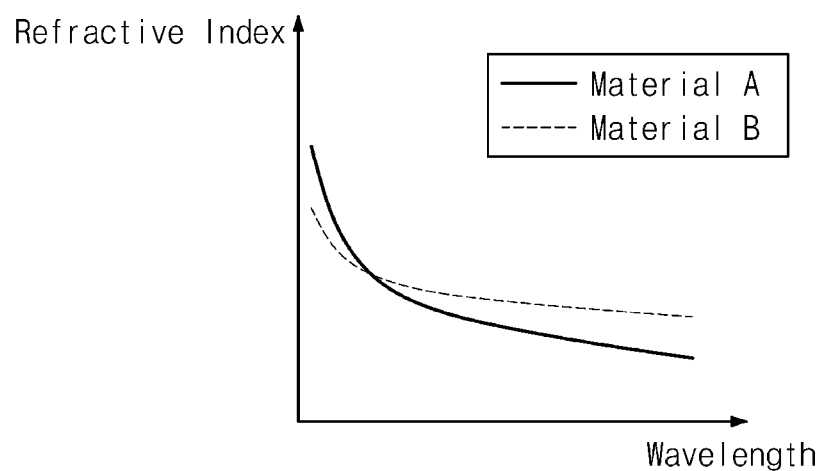
FIGS. 9A and 9B are graphs illustrating a variation in refractive index depending on a wavelength of a material of the window layer according to an embodiment.
Figure 9B:
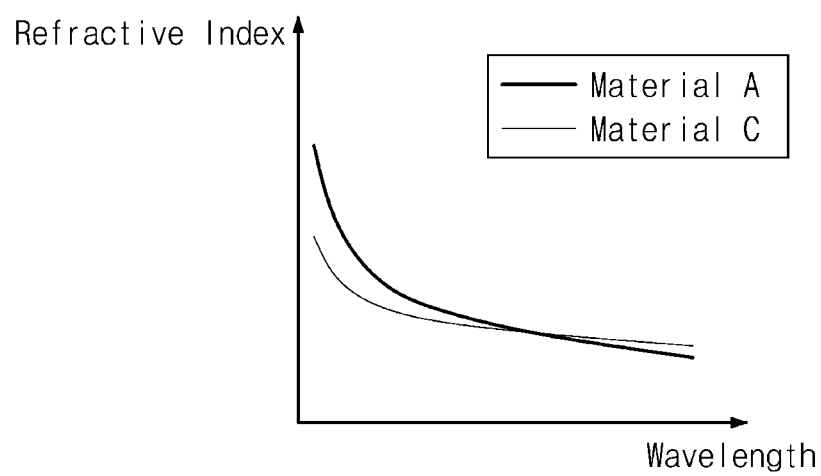

FIGS. 9A and 9B are graphs illustrating a variation in refractive index depending on a wavelength of a material of the window layer WL according to an embodiment. FIG. 9A illustrates a difference in refractive index between a material A and a material B according to a variation in wavelength, and FIG. 9B illustrates a difference in refractive index between the material A and a material C according to a variation in wavelength. A horizontal axis of the graph represents a wavelength, and a vertical axis represents a refractive index n. The material A is a glass substrate as a material that is capable of being used for the first and second rigid parts, and each of the materials B and C is an optically transparent resin as a material that is capable of being used for the first soft part. However, this embodiment is not limited thereto.

Referring to FIGS. 9A and 9B, each of the materials A to C has a different refractive index according to a wavelength. The refractive index value decreases as the wavelength increases. The variation in refractive index according to the variation in wavelength may be larger as the wavelength increases, and the variation may decrease as the wavelength increases. Since the refractive index of each of the materials varies according to the wavelength, the materials having a less difference in refractive index depending on the transmitted wavelength may be selectively combined. In the case of the different materials, dispersion of the refractive index may not be completely coincident, but there may be a case in which the refractive indexes coincide with each other at a short wavelength as illustrated in FIG. 9A and a case in which the refractive indexes coincide with each other at a long wavelength as illustrated in FIG. 9B.

Thus, when the material B, in which a difference in refractive index with respect to the material A is minimized in the blue wavelength region, is used for the first soft part in FIG. 8A, the total reflection at each of the interfaces IF1 and IF2 (see FIG. 8A) may be reduced. Thus, when the material C, in which a difference in refractive index with respect to the material A is minimized in the green and blue wavelength regions, is used for the first soft part in FIG. 8B, the total reflection at each of the interfaces IF1 and IF2 (see FIG. 8B) may be reduced.

In FIGS. 9A and 9B, a degree of dispersion of the materials B and C with respect to the material A is compared, but is not limited thereto. For example, in the combination of the materials, dispersion properties of the materials that are capable of being used for the first and second rigid parts may be compared with respect to the material of the first soft part, or dispersion properties of the materials of the first soft part and the first and second rigid parts may be compared to each other at the same time.

The display device according to an embodiment may include the first rigid part, the second rigid part, and the first soft part disposed between the first and second rigid parts to provide the display device having the sufficient strength while satisfying the excellent folding characteristics. Particularly, the material that is capable of minimizing the difference in refractive index between the rigid part and the soft part in a specific wavelength band may be provided, and also, the pixel area corresponding to the corresponding wavelength band may be disposed to overlap the interface to improve light extraction efficiency and visibility of the display device.

According to the related art, to prevent the image discontinuity occurring on the folding area or the excessive increase and decrease of the luminance, an auxiliary layer having a refractive index between the refractive index of the window and the refractive index of the soft part has been introduced as a single or multi-layer. However, this method has a disadvantage in that the manufacturing process is complicated, and the improvement in efficiency at the side surface is much greater than that in efficiency at the front surface.

According to an embodiment, the two materials, in which a difference in refractive index in the blue wavelength region or the green and red wavelength regions is about 0.02 or less, may be introduced, and the arrangement structure of the pixels overlapping the interface between the window part and the soft part may be changed to minimize the total reflection occurring on the interface. Thus, since the extraction efficiency of light, which is lost at the side surface or trapped in the element due to the total reflection on the folding area, may be improved to reduce the image discontinuity. In addition, since the same or more improved effect may be expected without introducing the auxiliary layer for reducing the total reflection, the reliability and productivity of the display device may be further improved.

According to an embodiment, the display device having the improved folding characteristics while having the excellent impact resistance may be provided.

According to an embodiment, the display device from which the sense of discontinuity of the image is removed at the folded portion may be provided.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising a first non-folding area, a second non-folding area, and a folding area disposed between the first non-folding area and the second non-folding area, which are disposed in a first direction, the display device comprising:
   a display panel comprising first pixel areas, second pixel areas, and third pixel areas, which are spaced apart from each other on a plane defined in the first direction and a second direction crossing the first direction; and
   a window layer disposed on the display panel,
   wherein the window layer comprises a first rigid part corresponding to the first non-folding area, a second rigid part corresponding to the second non-folding area, and a first soft part corresponding to the folding area,
   each of a first interface between the first rigid part and the first soft part and a second interface between the second rigid part and the first soft part overlaps at least one area of the first to third pixel areas on the plane, and
   each of an absolute value of a difference in refractive index between the first rigid part and the first soft part, which is measured at a center wavelength of light emitted from the pixel area overlapping the first interface, and an absolute value of a difference in refractive index between the second rigid part and the first soft part, which is measured at a center wavelength of light emitted from the pixel area overlapping the second interface, is 0.02 or less.

2. The display device of claim 1, wherein each of the first interface and the second interface overlaps the first pixel areas on the plane.

3. The display device of claim 1, wherein each of the first interface and the second interface overlaps the second pixel areas and the third pixel areas on the plane.

4. The display device of claim 3, wherein each of absolute values of a difference in refractive index between the first rigid part and the first soft part and between the second rigid part and the first soft part, which are respectively measured at center wavelengths of the light emitted from the second pixel areas and the third pixel areas, is 0.02 or less.

5. The display device of claim 1, wherein the light emitted from the first pixel areas has a center wavelength range of 410 nm to 480 nm,
   the light emitted from the second pixel areas has a center wavelength range of 500 nm to 570 nm, and
   the light emitted from the third pixel areas has a center wavelength range of 625 nm to 675 nm.

6. The display device of claim 1, wherein the first pixel areas are arranged in the second direction to define a first area,
   the second pixel areas and the third pixel areas are alternately arranged in the second direction to define a second area, and
   the first area and the second area are disposed to be spaced apart from each other in the first direction.

7. The display device of claim 1, wherein each of the first pixel areas has a surface area greater than that of each of the second pixel areas and the third pixel areas on the plane.

8. The display device of claim 1, further comprising a second soft part disposed between the display panel and the window layer.

9. The display device of claim 8, further comprising a third soft part disposed on the window layer.

10. The display device of claim 9, wherein the second soft part and the third soft part are made of the same material.

11. The display device of claim 10, further comprising a protective layer disposed on the third soft part.

12. The display device of claim 1, wherein each of the first rigid part and the second rigid part has a compression modulus of 15 GPa or more, and
the first soft part has a compression modulus of less than 15 GPa.

13. A display device comprising a first non-folding area, a second non-folding area, and a folding area disposed between the first non-folding area and the second non-folding area, which are disposed in a first direction, the display device comprising:
a display panel comprising a first area, which comprises first pixel areas arranged to be spaced apart from each other in a second direction crossing the first direction, and a second area, which comprises second pixel areas and third pixel areas, which are alternately arranged in the second direction, wherein the first area and the second area are alternately disposed in the first direction; and
a window layer disposed on the display panel,
to wherein the window layer comprises a first rigid part corresponding to the first non-folding area, a second rigid part corresponding to the second non-folding area, and a first soft part corresponding to the folding area, and
pixel areas on which a first interface between the first rigid part and the first soft part and a second interface between the second rigid part and the first soft part overlap each other are the same.

14. The display device of claim 13, wherein each of an absolute value of a difference in refractive index between the first rigid part and the first soft part, which is measured at a center wavelength of the light emitted from the pixel area overlapping the first interface and an absolute value of a difference in refractive index between the second rigid part and the first soft part, which is measured at a center wavelength of the light emitted from the pixel area overlapping the second interface, is 0.02 or less.

15. The display device of claim 13, wherein each of the first pixel areas has a surface area greater than that of each of the second pixel areas and the third pixel areas on a plane.

16. The display device of claim 13, wherein each of the first interface and the second interface overlaps the first area, and
the light emitted from the first pixel areas has a center wavelength range of 410 nm to 480 nm.

17. The display device of claim 13, wherein each of the first interface and the second interface overlaps the second area, and
each of absolute values of a difference in refractive index between the first rigid part and the first soft part and between the second rigid part and the first soft part, which are respectively measured at center wavelengths of the light emitted from the second pixel area and the third pixel areas, is 0.02 or less.

18. The display device of claim 13, wherein the light emitted from the second pixel areas has a center wavelength range of 500 nm to 570 nm, and
the light emitted from the third pixel areas has a center wavelength range of 625 nm to 675 nm.

19. The display device of claim 13, further comprising a second soft part disposed between the display panel and the window layer.

20. The display device of claim 19, further comprising a third soft part disposed on the window layer,
wherein the window layer has a thickness less than that of each of the second soft part and the third soft part.

* * * * *